(12) United States Patent
Yoshizumi et al.

(10) Patent No.: US 8,809,879 B2
(45) Date of Patent: Aug. 19, 2014

(54) LIGHT-EMITTING DEVICE AND A METHOD OF MANUFACTURING LIGHT-EMITTING DEVICE

(75) Inventors: Kensuke Yoshizumi, Kanagawa (JP); Koji Ono, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 37 days.

(21) Appl. No.: 13/439,237

(22) Filed: Apr. 4, 2012

(65) Prior Publication Data

US 2012/0256204 A1   Oct. 11, 2012

(30) Foreign Application Priority Data

Apr. 7, 2011 (JP) .................. 2011-085581

(51) Int. Cl.
*H01L 33/08* (2010.01)
*H01L 33/52* (2010.01)

(52) U.S. Cl.
USPC .................. 257/88; 438/26; 257/E33.059

(58) Field of Classification Search
USPC .......... 257/79–103, 57, 59, 66, 72, 359, 390, 257/443, E21.411, E21.412, E51.005, 257/E29.151, E27.1, E29.117; 438/30, 149, 438/158–159
See application file for complete search history.

(56) References Cited

U.S. PATENT DOCUMENTS

| | | | |
|---|---|---|---|
| 2002/0158568 A1* | 10/2002 | Satake | 313/493 |
| 2005/0174064 A1 | 8/2005 | Agostinelli et al. | |
| 2005/0225973 A1 | 10/2005 | Eliashevich et al. | |
| 2006/0011913 A1* | 1/2006 | Yamazaki | 257/59 |
| 2008/0287028 A1* | 11/2008 | Ozawa | 445/24 |
| 2009/0221109 A1* | 9/2009 | Choi et al. | 438/33 |

FOREIGN PATENT DOCUMENTS

| | | |
|---|---|---|
| JP | 2000-29404 | 1/2000 |
| JP | 2009-130132 | 6/2009 |

* cited by examiner

*Primary Examiner* — Fernando L Toledo
*Assistant Examiner* — Lawrence-Linh T Nguyen
(74) *Attorney, Agent, or Firm* — Husch Blackwell LLP

(57) ABSTRACT

To provide a highly reliable light-emitting device and especially a light-emitting device which can be formed without use of a metal mask and includes a plurality of light-emitting elements. A structural body at least an end of which has an acute-angled shape is provided so that the end can pass downward through an electrically conductive film formed over the insulating layer and can be at least in contact with an insulating layer having elasticity, thereby physically separating the electrically conductive film, and the electrically conductive films are thus electrically insulated from each other. Such a structure may be provided between adjacent light-emitting elements so that the light-emitting elements can be electrically insulated from each other in the light-emitting device.

17 Claims, 10 Drawing Sheets

LIGHT-EMITTING DEVICE AND A METHOD OF MANUFACTURING LIGHT-EMITTING DEVICE

BACKGROUND OF THE INVENTION

1. Field of the Invention

The present invention relates to a light-emitting device to which an organic EL element is applied and a method of manufacturing the light-emitting device.

2. Description of the Related Art

Research and development have been extensively conducted on organic EL (electroluminescent) elements. The basic structure of an organic EL element includes a layer containing a light-emitting organic compound which is provided between a pair of electrodes. Voltage application to this element can cause light emission to be obtained from the light-emitting organic compound.

Organic EL elements can be formed in the form of a film and therefore can easily constitute large-area elements, and also have great potential as planar light sources applicable to lighting and the like.

For example, Patent Document 1 discloses a lighting device including an organic EL element.

REFERENCE

[Patent Document 1] Japanese Published Patent Application No. 2009-130132

SUMMARY OF THE INVENTION

For the formation of an organic EL element (hereinafter, referred to as light-emitting element), a vacuum evaporation method is one example of the method by which a layer containing a light-emitting organic compound and an upper electrode are sequentially stacked over a lower electrode formed over a substrate having an insulating surface. As the method by which an island-shaped layer is formed using the vacuum evaporation method, a method using a metal mask (also referred to as shadow mask), which is a metal plate provided with an opening, is known. With the metal mask that is provided between a substrate and an evaporation source and is in contact with the substrate, the substrate is subjected to evaporation through the opening portion in the metal mask, so that a deposition film having a shape in accordance with the pattern of the opening portion can be formed. Note that as the distance between the metal mask and the substrate is shorter, it is possible to form an island-shaped layer with a clearer shape based on the opening portion, in other words, a shape whose periphery is less obscure.

Further, the use of a metal mask in contact with a substrate is more likely to invite a trouble. For example, an opening edge in the opening portion of a metal mask might damage a surface of a substrate. Specifically, contact of a metal mask with a substrate might cause an opening edge in the metal mask to scratch a substrate surface, thereby breaking another layer already formed over the substrate. In particular, overlap between an opening edge in a metal mask and a region near a light-emitting region might short-circuit a light-emitting element. Furthermore, dust (including a small extraneous substance referred to as particle) which is adhered to the metal mask could possibly be transferred from the metal mask to the substrate.

In addition, use of a large metal mask for a large substrate might cause a problem in that a pattern is displaced owing to a bend or the like of a metal plate used as the metal mask. An increase in the thickness of the metal plate for preventing such a problem might cause problems in that the outer edge portion of a formed island-shaped pattern becomes obscure, and the metal mask significantly increases in weight to be difficult to handle.

At the same time, light-emitting devices have been required to increase in area for application of planar light-emitting devices having light-emitting elements to lighting provided on a wall or a ceiling. For the increase in the size of light-emitting devices, a structure in which light-emitting elements provided in tiled arrangement are each individually driven is preferred, instead of a light-emitting device constituted of one light-emitting element. In such a structure, even when one light-emitting element suffers a trouble such as a short circuit, the other light-emitting elements can be driven to emit light. Moreover, since light-emitting elements are each individually driven, adjustment of light from the whole light-emitting device can be easily controlled.

When formed over the same substrate and each individually driven, light-emitting elements need to be electrically insulated from each other. An example of such a method is the one by which island-shaped EL layers and upper electrodes are formed over island-shaped lower electrodes with use of a metal mask to fabricate a plurality of light-emitting elements. However, this method has problems of the trouble due to a metal mask as described above, difficulty in increasing the size of a substrate, low productivity, and the like.

Note that in this specification and the like, the term metal mask refers to a mask including opening portions for forming a plurality of island-shaped patterns over a substrate. Thus, the term metal mask does not include a blocking mask for providing a region where a film is not formed in the outer periphery (e.g., a region outer than a sealed region) sufficiently apart from a light-emitting element. Note that in the case where a wiring electrically connected to a light-emitting element is formed over a substrate, the blocking mask may have an opening edge which overlaps with the wiring.

Note that in this specification, the term EL layer refers to a layer provided between a pair of electrodes of a light-emitting element and including at least a layer including a light-emitting organic compound (also referred to as light-emitting layer), or a stack including the light-emitting layer.

Embodiments of the present invention are made in view of the foregoing technical background. Therefore, an object of one embodiment of the present invention is to provide a highly reliable light-emitting device, especially a light-emitting device which can be formed without use of a metal mask and which includes a plurality of light-emitting elements, and another object is to provide a method of manufacturing the light-emitting device.

In order to achieve the above objects, the present invention reaches an idea of physically separating a planar electrically conductive film after forming it as follows: a structural body at least an end of which has an acute-angled shape is provided so that the end can pass downward through an electrically conductive film formed over the insulating layer and can be at least in contact with an insulating layer having elasticity, thereby physically separating the electrically conductive film, and the electrically conductive films are thus electrically insulated from each other. Such a method may be employed for adjacent light-emitting elements.

Specifically, a light-emitting device in accordance with one embodiment of the present invention includes a first light-emitting element including a first lower electrode layer, a first layer including a light-emitting organic compound, and a first upper electrode layer that are stacked, and includes a second light-emitting element including a second lower electrode layer, a second layer including a light-emitting organic compound, and a second upper electrode layer that are stacked. In the light-emitting device, the first light-emitting element and the second light-emitting element are adjacent with an insulating layer therebetween, a structural body at least an end of which has an acute-angled shape and is in contact with the insulating layer is provided over the insulating layer, and the first upper electrode layer is formed in the same layer as the second upper electrode layer and is separated over the insulating layer from the second upper electrode layer by the structural body at least the end of which has an acute-angled shape.

In the light-emitting device having the above structure, the upper electrode layer and the layer including a light-emitting organic compound, which are formed without use of a metal mask, can each be physically separated; thus, the light-emitting device includes the light-emitting elements which are electrically insulated from each other. No use of a metal mask can prevent the trouble due to a metal mask as described above, so that the light-emitting device can have high reliability. In addition, no use of a metal mask enables application to a large-sized substrate. Also in manufacture of a plurality of light-emitting devices over the same substrate, a structural body at least an end of which has an acute-angled shape between adjacent light-emitting devices enables the light-emitting devices to be electrically insulated from each other over the same substrate without use of a metal mask.

Another embodiment of the present invention is a light-emitting device which has the structure of the above light-emitting device and in which the first light-emitting element, the second light-emitting element, and the insulating layer are provided over a first substrate, the structural body at least the end of which has an acute-angled shape is provided over a second substrate, a surface of the second substrate, which faces the first light-emitting element and the second light-emitting element, has a concave portion, and the second substrate is not in contact with the first light-emitting element and the second light-emitting element.

The above structural body at least the end of which has an acute-angled shape, which is provided over the surface of the second substrate, is formed so as to be in contact with the insulating layer in the step of bonding the first substrate provided with the light-emitting element to the second substrate. Owing to the structural body at least the end of which has an acute-angled shape over the second substrate in advance, light-emitting elements can be electrically insulated from each other using a conventional bonding step, and such a structure is easy to use with the conventional step.

Further, since the structural body at least the end of which has an acute-angled shape is formed to project out from the surface of the second substrate, adjustment of the height of the structural body at least the end of which has an acute-angled shape makes it easy to provide a light-emitting device having a so-called sealed hollow structure in which there is a space between the surface of the second substrate and the light-emitting elements over the first substrate. For example, the inside of the light-emitting device having a sealed hollow structure is filled with an inert gas or is in a reduced-pressure state, in which impurities such as water and oxygen are reduced; consequently, the light-emitting device can have high reliability. Further, a spacer for preventing contact of the light-emitting elements with the second substrate need not be provided additionally, and enlargement of the non-light-emitting region, which might be caused if the spacer is provided additionally, can be suppressed; consequently, the light-emitting device can have high efficiency.

A method of forming a light-emitting device in accordance with one embodiment of the present invention includes the following steps: forming a first lower electrode layer and a second lower electrode layer over a surface of a first substrate so that the first lower electrode layer is adjacent to the second lower electrode layer; forming an insulating layer between the first lower electrode layer and the second lower electrode layer; forming a layer including a light-emitting organic compound, which covers the first lower electrode layer, the second lower electrode layer, and the insulating layer; forming an electrically conductive film over the layer including the light-emitting organic compound; forming a structural body at least an end of which has an acute-angled shape over a surface of a second substrate; and bonding the first substrate and the second substrate to each other so that an end of the structural body at least the end of which has an acute-angled shape physically separates the electrically conductive film over the insulating layer into a first upper electrode layer and a second upper electrode layer. In the method, the layer including the light-emitting organic compound and the electrically conductive film are each formed without use of a metal mask.

In the above formation method, a light-emitting device including a plurality of light-emitting elements electrically insulated from each other can be formed without use of a metal mask. Thus, a highly reliable light-emitting device for which the trouble due to a metal mask is prevented can be achieved. Further, since the above formation method does not require use of a metal mask, the method can easily be applied to a large-area substrate.

A method of forming a light-emitting device in accordance with one embodiment of the present invention includes the following steps: forming a first lower electrode layer and a second lower electrode layer over a surface of a first substrate so that the first lower electrode layer is adjacent to the second lower electrode layer; forming an insulating layer between the first lower electrode layer and the second lower electrode layer; forming a layer including a light-emitting organic compound, which covers the first lower electrode layer, the second lower electrode layer, and the insulating layer; forming an electrically conductive film over the layer including the light-emitting organic compound; forming a concave portion and a structural body at least an end of which has an acute-angled shape by etching of part of a surface of a second substrate; and bonding the first substrate and the second substrate to each other so that the end of the structural body physically separates the electrically conductive film over the insulating layer into a first upper electrode layer and a second upper electrode layer and the first lower electrode layer and the second lower electrode layer each overlap with the concave portion. In the method, the layer including the light-emitting organic compound and the electrically conductive film are each formed without use of a metal mask.

As described above, the structural body at least the end of which has an acute-angled shape can be formed by processing of part of the surface of the second substrate using etching. By such processing of a surface of the second substrate in the formation of the structural body, the concave portion can be formed in a region which is part of the second substrate. Bonding this second substrate and the first substrate to each other leads to ease of manufacture of a light-emitting device having a sealed hollow structure in which there is a space between the light-emitting elements and the second substrate. Therefore, a spacer for preventing contact of the light-emitting elements with the second substrate is not needed, and the complexity of the process which might be caused if the spacer is provided can be avoided; consequently, the light-emitting device can have high reliability. In particular, for a top-emission light-emitting device, enlargement of the non-light-emitting region, which might be caused if the spacer is provided, can be suppressed; consequently, the light-emitting device can have high efficiency.

A method of forming a light-emitting device in accordance with one embodiment of the present invention includes the following steps: forming a first lower electrode layer and a second lower electrode layer over a surface of a first substrate so that the first lower electrode layer is adjacent to the second lower electrode layer; forming an insulating layer between the first lower electrode layer and the second lower electrode layer; forming a layer including a light-emitting organic compound, which covers the first lower electrode layer, the second lower electrode layer, and the insulating layer; forming an electrically conductive film over the layer including the light-emitting organic compound; and pressing a separating instrument with an end portion having an acute-angled shape downward on the insulating layer so that the end portion of the separating instrument physically separates the electrically conductive film over the insulating layer into a first upper electrode layer and a second upper electrode layer. In the method, the layer including the light-emitting organic compound and the electrically conductive film are each formed without use of a metal mask.

In the above formation method, the electrically conductive film that is to be upper electrode layers of the adjacent light-emitting elements and is formed without use of a metal mask can be separated in advance by the separating instrument with an end portion having an acute-angled shape; therefore, the step of forming a structural body at least an end of which has an acute-angled shape over the second substrate can be omitted. Further, providing the second substrate can be omitted or a thin film or the like can be used as the second substrate, so that the light-emitting device can be thin and light-weight.

One embodiment of the present invention can provide a highly reliable light-emitting device, and especially a light-emitting device which includes a plurality of light-emitting elements and which can be formed without use of a metal mask.

DETAILED DESCRIPTION OF THE INVENTION

Figure 1:
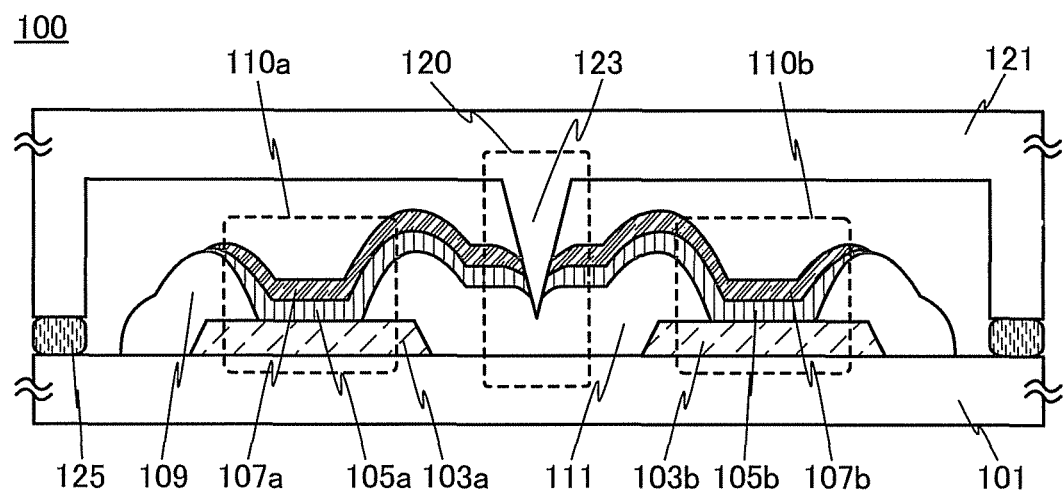
FIG. 1 illustrates a light-emitting device in accordance with one embodiment of the present invention.

Embodiments, will be described in detail with reference to the drawings. Note that the present invention is not limited to the following description and it will be readily appreciated by those skilled in the art that the modes and details of the present invention can be modified in various ways without departing from the spirit and scope thereof. Therefore, the present invention should not be interpreted as being limited to the description in the following embodiments and examples. Note that the same portions or portions having similar functions are commonly denoted by the same reference numerals in different drawings, and repetitive description thereof is omitted.

In the drawings referred to in this specification, the size, layer thickness, or region of each component may be exaggerated for clarity. Therefore, the scale of each structure is not necessarily limited to that illustrated in the drawings.

Embodiment 1

In this embodiment, a structure of a light-emitting device including light-emitting elements electrically insulated from each other and a manufacturing method of the light-emitting device are described with reference to FIG. 1, FIGS. 2A to 2C, FIGS. 3A to 3C, and FIGS. 4A and 4B.

⟨Structure Example⟩

A schematic cross-section of a light-emitting device 100 which is one embodiment of the present invention is illustrated in FIG. 1. The light-emitting device 100 is a light-emitting device including, over a substrate 101, two light-emitting elements (light-emitting elements 110a and 110b) electrically insulated from each other and a separating portion 120 by which an upper electrode layer and an EL layer in the light-emitting elements are each physically separated. Note that in this structure example, although the light-emitting device having the two light-emitting elements is exemplified, the number of the light-emitting elements may be three or more.

The light-emitting element 110a includes a lower electrode layer 103a, an EL layer 105a, and an upper electrode layer 107a. Application of a voltage between the lower electrode layer 103a and the upper electrode layer 107a causes light emission from the EL layer 105a to be obtained. Similarly, the light-emitting element 110b includes a lower electrode layer 103b, an EL layer 105b, and an upper electrode layer 107b.

Some edge portions of the lower electrode layers 103a and 103b are each covered with a partition wall 109. The partition wall 109 is provided in order to prevent a short-circuit between the lower electrode layer 103a and the upper electrode layer 107a or between the lower electrode layer 103b and the upper electrode layer 107b at a step portion which is formed by either edge portion and might cause a split in the EL layer 105a or the EL layer 105b. Note that the partition wall 109 is not necessarily provided.

Further, an insulating layer 111 is provided between the lower electrode layer 103a and the lower electrode layer 103b. The insulating layer 111 is preferably formed with a material having elasticity to the extent that an end of a structural body 123 to be described later, which has an acute-angled shape, can be buried in the material.

In this structure example, part of the insulating layer 111 covers facing edge portions of the lower electrode layers 103a and 103b, in the way that the partition wall 109 covers the edge portions as described above. Note that the insulating layer 111 does not necessarily cover the edge portions. While the partition wall 109 covers the facing edge portions of the lower electrode layers 103a and 103b, the insulating layer 111 that does not cover these edge portions may be provided between the lower electrode layers 103a and 103b.

The outer periphery of a counter substrate 121 is adhered to the substrate 101 by a sealant 125. The structural body 123 at least an end of which has an acute-angled shape is formed in a region of a surface of the counter substrate 121 which faces the substrate 101 and which overlaps with the insulating layer 111. Further, a concave portion is formed in a region of the counter substrate 121 surface, in which the outer periphery and the structural body 123 are not formed and which overlaps with the at least light-emitting elements 110a and 110b.

In the separating portion 120, the structural body 123 having an acute-angled shape is provided so that the end can be buried downward into the insulating layer 111 with which the substrate 101 is provided. Consequently, in the separating portion 120, the EL layer and the upper electrode layer are each physically separated over the insulating layer 111 by the structural body 123 having an acute-angled shape. In other words, the structural body 123 having an acute-angled shape makes the physical separation into the EL layer 105a and the EL layer 105b and into the upper electrode layer 107a and the upper electrode layer 107b. Thus, the light-emitting element 110a and the light-emitting element 110b are electrically insulated from each other in such a way that the separating portion 120 is the boundary therebetween.

In this embodiment, a structure in which the end of the structural body 123 is buried in the insulating layer 111 is described. Note that the end of the structural body 123 at least penetrates through the upper electrode layer and the EL layer to be in contact with a surface of the insulating layer 111.

Here, the structural body 123 having an acute-angled shape has rigidity at least to the extent that the insulating layer 111 can be changed in form. An angle formed between sides of the structural body 123 having an acute-angled shape is preferably greater than or equal to 1° and less than or equal to 60°, more preferably greater than or equal to 5° and less than or equal to 30°. Further, a cross-section of the end portion may be a curved surface shape; in that case, the curvature radius of the end portion of the structural body 123 is less than or equal to a half of the thickness of the insulating layer 111, preferably less than or equal to one-tenth thereof.

When the separating portion 120 including the structural body 123 having an acute-angled shape and the insulating layer 111 as described above is provided in the light-emitting device 100, the EL layer and the upper electrode layer formed without use of a metal mask can each be certainly physically separated, and consequently electrical insulation between the two light-emitting elements 110a and 110b in the light-emitting device 100 can be ensured. The light-emitting device 100 as described above, for which the trouble due to a metal mask can be avoided, can have high reliability.

Further, because of the concave portion provided in the counter substrate 121, it is easy to form the light-emitting device 100 having a sealed hollow structure in which there is a space between the counter substrate 121 and the light-emitting elements 110a and 110b. Therefore, a spacer for preventing contact of the light-emitting elements 110a and 110b with the counter substrate 121 is not needed, and the complexity of the process, which might be caused if the spacer is provided, can be avoided; consequently, the light-emitting device 100 can have high reliability. In particular, for a top-emission light-emitting device, enlargement of the non-light-emitting region, which might be caused if the spacer is additionally provided, can be suppressed; consequently, the light-emitting device 100 can have high efficiency.

The light-emitting device of one embodiment of the present invention can be applied to any of the following: a top-emission light-emitting device in which light is emitted in the direction of a side of a substrate provided with a light-emitting element, on which the light-emitting element is formed; a bottom-emission light-emitting device in which light is emitted in the direction of a side of the substrate, which is opposite to the side on which a light-emitting element is formed; and a dual-emission light-emitting device in which light is emitted in the directions of the opposite sides of the substrate. For the top- or bottom-emission structure, a material capable of transmitting light emission from the EL layer is used for each of the electrode layer and substrate which are used on the side toward which light is emitted, whereas a material capable of reflecting the light emission is used for the electrode layer provided opposite to the side toward which light is emitted. For the dual-emission structure, a material having a light-transmitting property can be used for both the electrode layers and both the substrates.

For the bottom-emission structure having a counter substrate, the light-emitting device may have a drying agent or an adsorbent agent in the space between the light-emitting elements and the counter substrate. The drying agent or the adsorbent agent reduces impurities such as water inside the sealed region, which leads to suppression of deterioration of the light-emitting elements; consequently, the light-emitting device can have high reliability.

Further, after the upper electrode layer is formed, a protective film covering the EL layer and the upper electrode layer may be formed. The protective film suppresses entry of impurities, such as water and oxygen, into the light-emitting element, so that the light-emitting device can have high reliability. For the protective film, a material through which moisture and oxygen are unlikely to pass, such as an organic insulating film or an inorganic insulating film, is used, and a film formation method such as a sputtering method, a printing method, or a coating method can be used.

⟨Manufacturing Process Example⟩

Next, an example of a method of manufacturing the light-emitting device 100 is described below with reference to FIGS. 2A and 2B, FIGS. 3A to 3C, and FIGS. 4A and 4B.

Figure 2A:
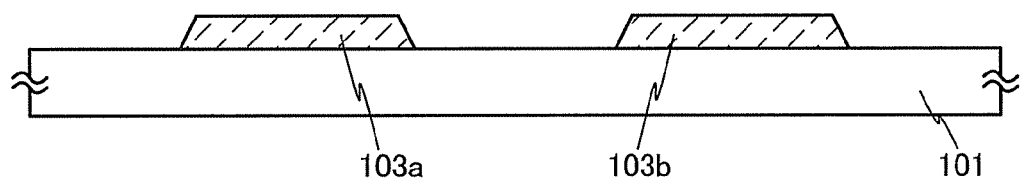
FIGS. 2A to 2C illustrate a method of manufacturing a light-emitting device in accordance with one embodiment of the present invention.
Figure 2B:
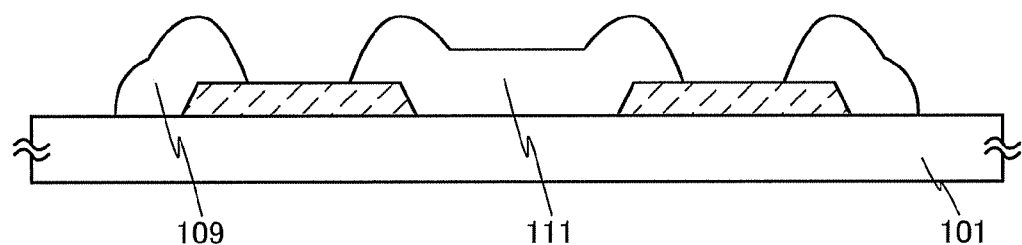
Figure 2C:
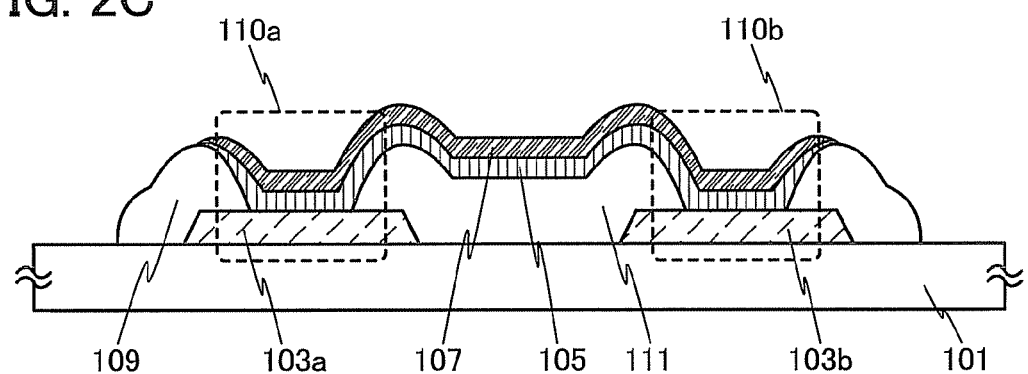

To begin with, the two light-emitting elements (light-emitting elements 110a and 110b) are formed over the substrate 101 (see FIGS. 2A to 2C).

First, an electrically conductive film is formed over the substrate 101 using a film formation method such as a sputtering method. After that, an unnecessary portion of the electrically conductive film is removed using a known patterning technique such as a photolithography method, so that the lower electrode layers 103a and 103b are formed (see FIG. 2A).

Note that before the above electrically conductive film is formed, a base insulating film covering a surface of the substrate 101 may be formed. A film functioning as a passivation film which prevents diffusion of impurities such as water and oxygen from the substrate 101 or as a planarization film which reduces unevenness of the surface of the substrate 101 can be formed, or a stack of such films may be used as the base insulating film. A deposition method such as a sputtering method or a CVD method, a coating method such as a dipping method, a spin coating method or an inkjet method, a printing method such as a screen printing method, or the like can be used as appropriate for the base insulating film depending on its material.

Next, the partition wall 109 and the insulating layer 111 which cover the edge portions of the lower electrode layers 103a and 103b are formed. First, a photosensitive organic resin film is formed over the substrate 101 and the lower electrode layers 103a and 103b, and then an unnecessary portion is removed by light exposure through a photomask and development treatment. Thus, the partition wall 109 and the insulating layer 111 are formed (see FIG. 2B).

Here, the insulating layer 111 is preferably thick for the reason that the structural body 123 having an acute-angled shape is to be buried in the insulating layer 111. The insulating layer 111 is preferably at least thicker than a stack of the EL layer and the upper electrode layer which constitute the light-emitting elements or than the sealant 125 which is to be formed later.

The partition wall 109 and the insulating layer 111 may be formed separately in different steps when the insulating layer 111 is formed so as to be thicker than the partition wall 109 for the above reason, although they are formed with the same material in one step in this embodiment. A multi-tone mask such as a half-tone mask or a gray-tone mask may be used as the photomask used for the light exposure so that the insulating layer 111 can be thicker than the partition wall 109.

Next, an EL layer 105 and an upper electrode layer 107 are formed. For the EL layer 105 and the upper electrode layer 107, films are formed over a region overlapping with at least exposed portions of the lower electrode layers 103a and 103b without use of a metal mask. The EL layer 105 can be formed by an evaporation method, for example. The upper electrode layer 107 can be formed by a deposition method such as an evaporation method or a sputtering method.

In this embodiment, after the EL layer 105 is formed by an evaporation method, the upper electrode layer 107 is formed in a region overlapping with the EL layer 105 by a sputtering method (see FIG. 2C).

At this stage, the light-emitting elements 110a and 110b are formed over the substrate 101. Note that at this stage, the two light-emitting elements 110a and 110b are electrically connected by the upper electrode layer 107.

Next, the way how the structural body 123 having an acute-angled shape is formed over the counter substrate 121 is described.

First, a resist 127a is formed over a region of the counter substrate 121 over which the structural body 123 having an acute-angled shape is to be formed, and a resist 127b is formed at a region of the outer periphery. The resists 127a and 127b are formed using a photosensitive organic resin through light exposure and development treatment (see FIG. 3A).

Here, the resist 127a is formed so as to have a so-called tapered shape in which a side closer to an edge portion has a smaller thickness. At this time, the area of the apex of the resist 127a is preferably as small as possible, in which case the end of the structural body 123 to be formed later, which has an acute-angled shape, can easily be sharp.

To have a trapezoidal or substantially rectangle cross-section, the resist 127b provided at the outer periphery of the counter substrate 121 is preferably formed so that, as compared with the apex of the resist 127a, the apex of the resist 127b can have a larger area and can be flat. As the area of the apex of the resist 127b is larger, the area of a region adhered with the sealant 125 at the outer periphery of the substrate 121 after processed can be larger, and the adhesive strength between the substrate 101 and the counter substrate 121 can be increased accordingly.

Therefore, the resist 127a and the resist 127b are formed with light exposure conditions varied so as to have different shapes. The resist 127a and the resist 127b may be formed with different materials so as to heave different shapes. Note that, in the case where different materials are used, each thickness should be determined in consideration of the difference of the rate at which a material is etched (etching rate) in a later etching step, which depends on the material.

As long as the area of the resist 127b is sufficiently large, the resist 127b may have a trapezoidal shape with the same tapered side as the resist 127a by the step by which the resist 127a is formed. The resist 127a and the resist 127b are preferably formed in one step, in which case the process can be simplified.

Then, the surface of the counter substrate 121, which is provided with the resists 127a and 127b, is subjected to anisotropic etching treatment in a perpendicular direction so that the exposed portion of the surface of the counter substrate 121 can be etched. In this etching step, the etching treatment is carried out under the conditions where both the resists 127a and 127b are also etched at the same time. As an etching method, dry etching using plasma, physical etching using collision of ions or particles, or the like can be used.

Figure 3A:
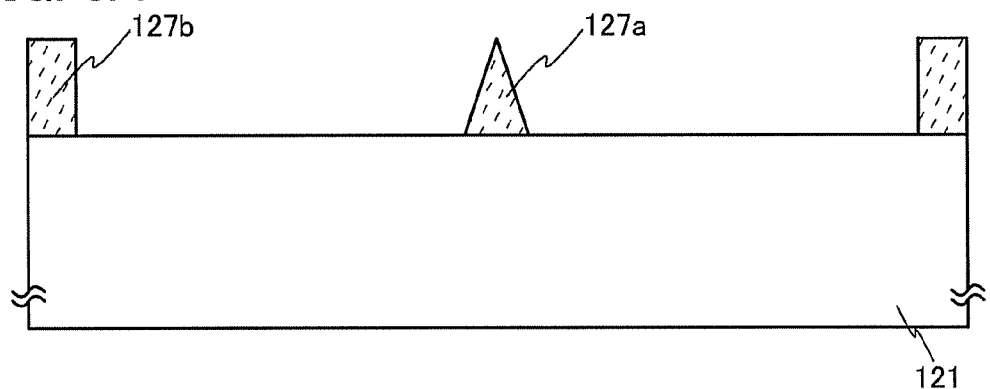
FIGS. 3A to 3C illustrate a method of manufacturing a light-emitting device in accordance with one embodiment of the present invention.
Figure 3B:
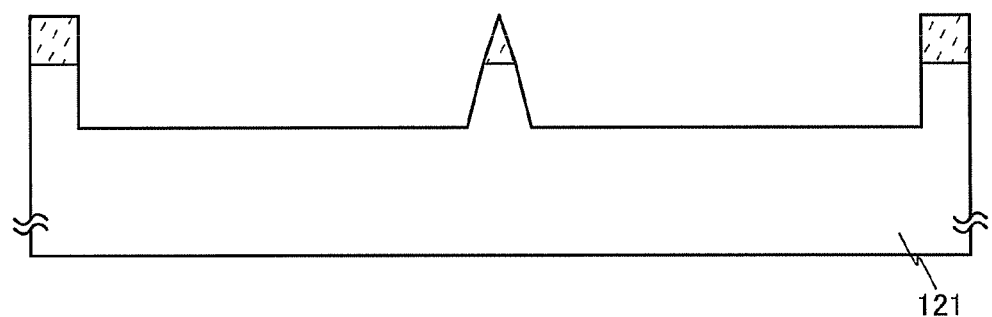

Here, a schematic cross-sectional view at the course of the etching step is illustrated in FIG. 3B. Through the etching treatment, removal is performed gradually from an edge portion of the resist 127a which has a smaller thickness, so that a region having a tapered shape in which a portion more apart from the edge portion has a larger thickness can be formed in a region under the resist 127a over the counter substrate 121. In contrast, at the outer periphery of the counter substrate 121, since the resist 127b has a trapezoidal or substantially rectangle cross-section, the thickness of the resist 127b is evenly reduced by the etching treatment, so that a tapered shape is not formed in a region under the resist 127b. Note that depending on the shape of the resist 127b, the outer periphery may have a tapered shape.

Next, the etching treatment is ended at the stage where at least the resist 127a is removed. If any, the remaining portion of the resist 127b at the outer periphery of the counter substrate 121 is removed. A schematic cross-sectional view at this stage is illustrated in FIG. 3C.

The counter substrate 121 processed as described above is provided with the structural body 123 having an acute-angled shape. In addition, the concave portion is formed by the etching in a region except the structural body 123 having an acute-angled shape and the outer periphery.

Figure 3C:
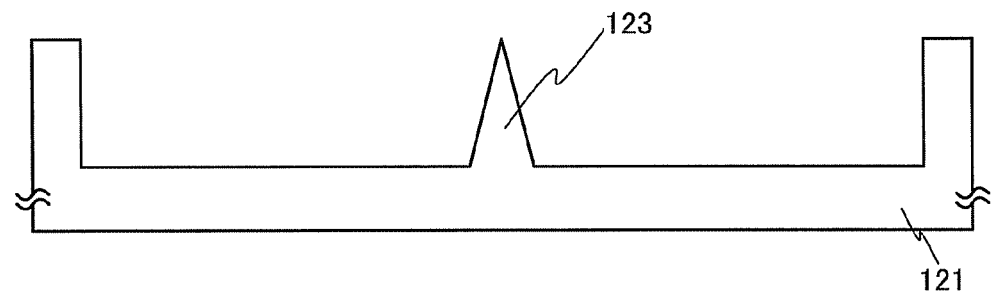

The height of the outer periphery of the counter substrate 121 and the height of the structural body 123 having an acute-angled shape are equal to each other in FIG. 3C when measured from the bottom of the concave portion of the counter substrate 121 obtained after the etching; however, in some cases, these heights are not equal depending on the shapes or materials of the resists 127a and 127b.

Conversely, control of the shapes or materials of the resists 127a and 127b allows control of the shapes of the structural body 123 having an acute-angled shape and the outer periphery which are obtained after the etching. For example, in the case where the outer periphery is desired to be taller than the structural body 123 having an acute-angled shape, the resist 127b is formed to be thicker or formed with a material with a lower etching rate than the resist 127a. Conversely, in the case where the outer periphery is desired to be lower than the structural body 123, the resist 127b is formed to be thinner or formed with a material with a higher etching rate than the resist 127a.

Although the structural body 123 having an acute-angled shape is formed by direct processing of the counter substrate 121 in this embodiment, the structural body 123 having an acute-angled shape may be formed in such a way that a thick insulating film is formed over the counter substrate 121 and processed by the above processing method. This formation method can prevent the counter substrate 121 from breaking during the processing, for example, in the case where an extremely thin glass substrate having a thickness of about 20 µm to 100 µm is used as the counter substrate. Further, such a formation method enables the structural body 123 having an acute-angled shape to be formed in the case where an electrically conductive substrate of a metal, an alloy, or the like is used as the counter substrate 121.

Then, the substrate 101 provided with the light-emitting elements 110a and 110b and the counter substrate 121 provided with the structural body 123 having an acute-angled shape are bonded to each other.

Figure 4A:
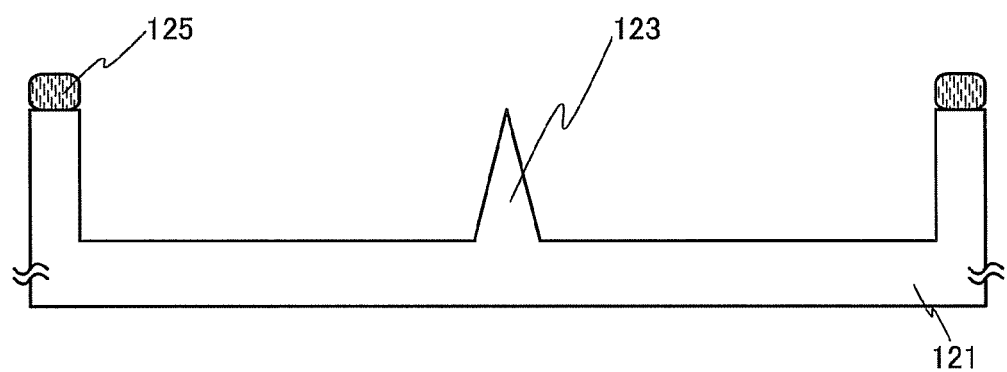
FIGS. 4A and 4B illustrate a method of manufacturing a light-emitting device in accordance with one embodiment of the present invention.

First, the sealant 125 is formed over a surface of a convex portion at the outer periphery of the counter substrate 121 (see FIG. 4A). The sealant 125 is formed by, for example, a printing method such as screen printing or a coating method such as a dispensing method.

Next, the substrate 101 and the counter substrate 121 are bonded with heat and pressure applied. The bonding step is preferably performed in a reduced-pressure atmosphere or an inert atmosphere, preferably in an atmosphere where impurities such as water and oxygen are reduced as much as possible. Through the bonding in such an atmosphere, impurities such as water and oxygen, which are contained in a space between the substrate 101 and the counter substrate 121, can be reduced, so that the light-emitting device 100 can have high reliability. The bonding step cures the sealant 125, and consequently the substrate 101 and the counter substrate 121 are adhered with the sealant 125.

Figure 4B:
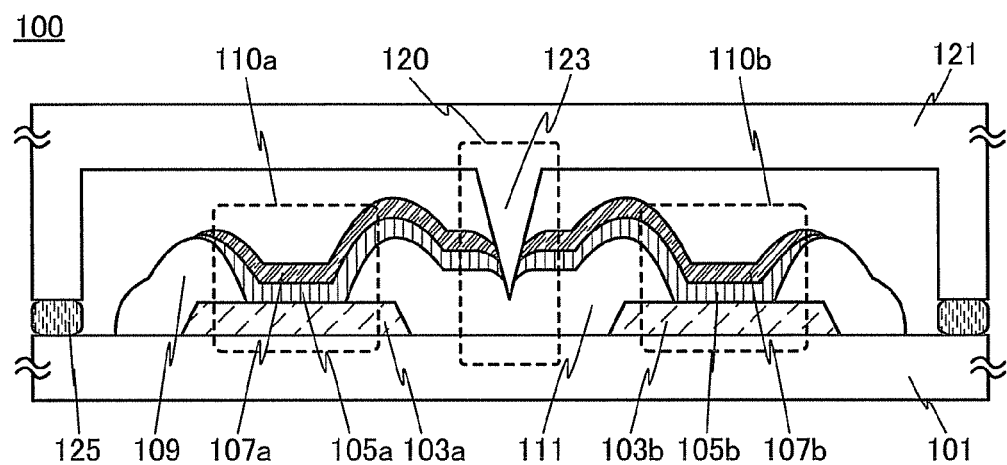

Here, the bonding is carried out so that the pressure at the bonding of the substrate 101 and the counter substrate 121 to each other can cause the end portion of the structural body 123 which has an acute-angled shape, with which the counter substrate 121 is provided, to pass through and physically separate each of the upper electrode layer 107 and the EL layer 105 which are provided just under the structural body 123, and also cause the end portion to be at least in contact with the insulating layer 111 (see FIG. 4B).

Such bonding physically separates the upper electrode layer 107 into the upper electrode layer 107a and the upper electrode layer 107b in such a way that the structural body 123 having an acute-angled shape is the boundary therebetween. The bonding further physically separates the EL layer 105 into the EL layer 105a and the EL layer 105b. Consequently, the light-emitting element 110a and the light-emitting element 110b are electrically insulated from each other.

Here, in the case where the height of the structural body 123 having an acute-angled shape is lower than or equal to that of the convex portion provided at the outer periphery, even the sealant 125 that is formed extremely thin can be used for the bonding while the end portion of the structural body 123 which has an acute-angled shape is prevented from being in contact with the surface of the substrate 101. It is preferable that the sealant 125 be extremely thin, in which case it is possible to reduce impurities entering the sealed region through the sealant 125 itself or a portion between the sealant 125 and the substrate 101 or between the sealant 125 and the counter substrate 121 where the adhesion is provided.

When the height of the structural body 123 having an acute-angled shape exceeds that of the convex portion at the outer periphery, the depth of a portion of the end of the structural body 123 having an acute-angled shape, which is buried in the insulating layer 111, can be controlled by adjustment of the thickness of the sealant 125 or a sealing condition. Therefore, even when a trouble in which the end portion of the structural body 123 which has an acute-angled shape does not reach the insulating layer 111 and the upper electrode layers cannot be electrically insulated from each other is detected after the bonding step, such a trouble can be solved by another bonding step for which the temperature and the pressure are adjusted. Without formation of the convex portion at the outer periphery of the counter substrate 121, a concave portion may be formed over every region where the structural body 123 having an acute-angled shape is not provided. In that case, the counter substrate 121 can be processed in accordance with the shape of the structural body 123 having an acute-angled shape; thus, the processing step of the counter substrate 121 can be simplified.

Although the end of the structural body 123 which has an acute-angled shape is buried in the insulating layer 111 in FIG. 4B, a sufficient structure is at least as follows: the end of the structural body 123 which has an acute-angled shape is in contact with the insulating layer 111 and the upper electrode layer 107 is physically separated. Note that at the vicinity of the end of the structural body 123 which has an acute-angled shape, a space may be formed between the upper electrode layer 107a and the EL layer 105a, between the upper electrode layer 107b and the EL layer 105b, and/or between the EL layer 105a and/or 105b and the insulating layer 111.

Through the above-described steps, the light-emitting device including light-emitting elements electrically insulated from each other can be fabricated without use of a metal mask. Further, the light-emitting device having a sealed hollow structure can be easily formed without a spacer for preventing contact of the light-emitting elements with the counter substrate. Thus, a fabrication process is simplified, so that the light-emitting device can have high reliability.

⟨Modification Example⟩

Figure 10A:
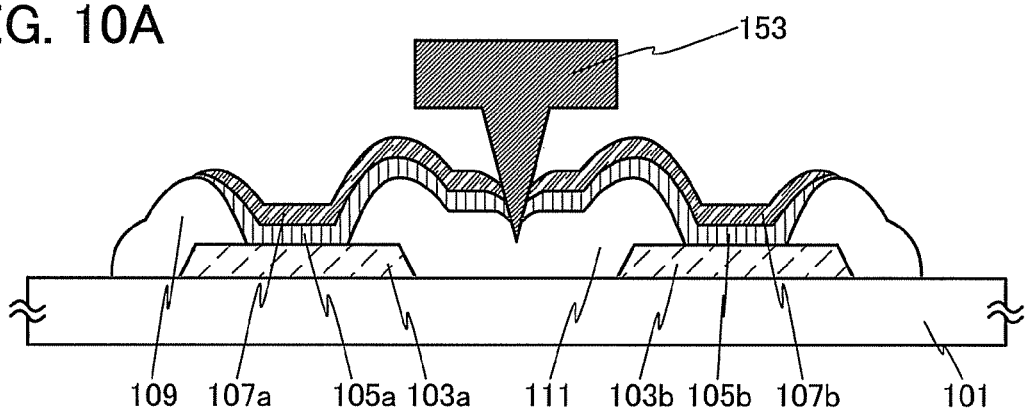
FIGS. 10A to 10C illustrate a method of manufacturing a light-emitting device in accordance with one embodiment of the present invention.
Figure 10B:
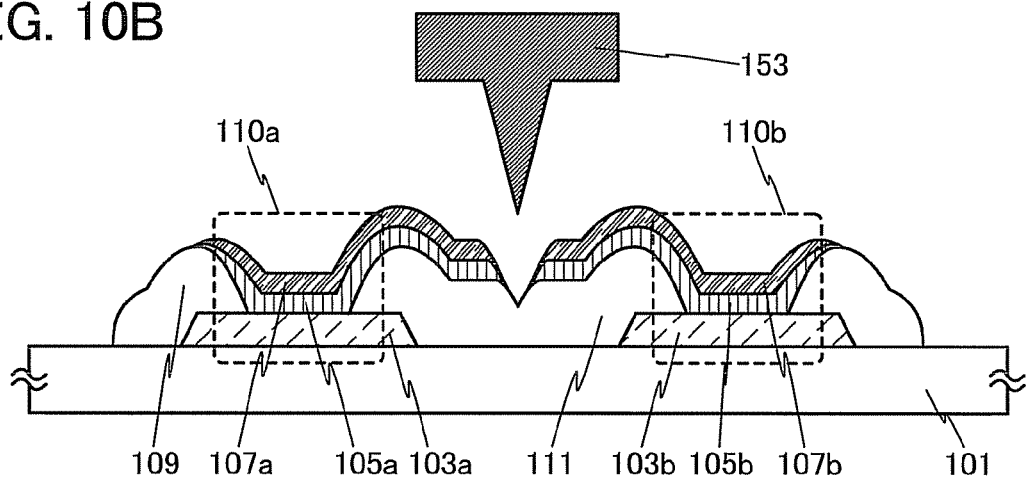
Figure 10C:
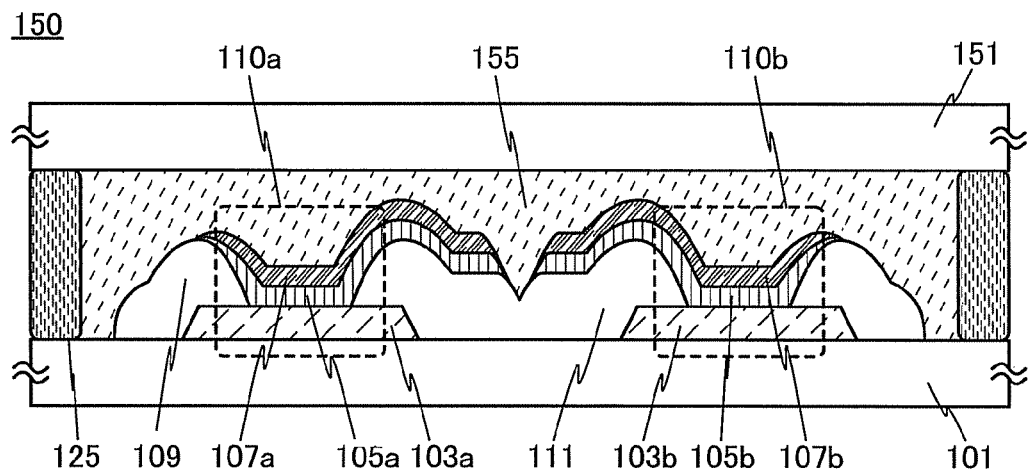

A manufacturing method of a light-emitting device, which is partly different from the above manufacturing method, is exemplified with reference to FIGS. 10A to 10C.

Here, the step of forming the light-emitting elements 110a and 110b over the substrate 101 is the same as that in the above manufacturing process example.

Next, a separating instrument 153 with an end portion having an acute-angled shape is pressed downward on the insulating layer 111 to physically separate each of the upper electrode layer 107 and the EL layer 105 over the insulating layer 111 (see FIG. 10A).

At this time, the separating instrument 153 is pressed so that the end portion having an acute-angled shape of the separating instrument 153 at least can pass through the upper electrode layer 107 and the EL layer 105 to be in contact with the insulating layer 111. Preferably, the separating instrument 153 is pressed to the extent that the end portion of the separating instrument 153 is buried in the insulating layer 111 and the surface of the insulating layer 111 is changed in form.

The separating instrument 153 has the end portion having an acute-angled shape similar to that of the above-described structural body 123 having an acute-angled shape. The separating instrument 153 may be a knife-like structure to separate a film over the substrate 101 when pressed on the substrate 101, or may have a rotary tooth to separate a film over the substrate 101 in such a way that the separating instrument 153 or the substrate 101 is scanned relative to the other along the insulating layer 111. Further, the end portion of the separating instrument 153 is preferably subjected to surface processing such as fluorine processing so as to prevent adhesion of a film in contact with the end portion having an acute-angled shape in order that occurrence of film peeling, which is due to adhesion of the film, be suppressed.

A schematic cross-sectional view of the stage after the separating instrument 153 is pressed downward on the insulating layer 111 to separate each of the upper electrode layer 107 and the EL layer 105 is illustrated in FIG. 10B. The separating instrument 153 physically separates the upper electrode layer into the upper electrode layers 107a and 107b and physically separates the EL layer into the EL layers 105a and 105b. Consequently, the light-emitting element 110a and the light-emitting element 110b are electrically insulated from each other.

After that, the substrate 101 and a counter substrate 151 are bonded to each other using the sealant 125 (see FIG. 10C).

As the counter substrate 151, the counter substrate 121 before processed which is used above can be used. Alternatively, a substrate provided with a concave portion in a region to overlap with either of the light-emitting elements may be used.

Preferably, a space between the substrate 101 and the counter substrate 151 is filled with a sealing material 155, as illustrated in FIG. 10C. When the sealing material 155 covers the light-emitting elements 110a and 110b, entry of impurities such as water and oxygen can be prevented and deterioration of the light-emitting elements can be suppressed. Further, when a depression that is formed on the insulating layer 111 with the separating instrument 153 is filled with the sealing material 155, the separated upper electrode layers can be prevented from being in contact with each other again. Note that the same material may be used for the sealing material 155 and the sealant 125.

Using such a manufacturing method, a light-emitting device 150 including the light-emitting elements electrically insulated from each other can be manufactured. In such a method, manufacture at lower cost is possible because the process can be simplified by omitting the step of forming a structural body at least an end of which has an acute-angled shape over a counter substrate. Further, the counter substrate can be omitted or can be an extremely thin film, and the light-emitting device can be thin and light-weight accordingly.

⟨Materials and Formation Methods⟩

Here, materials which can be used for the structures of light-emitting devices of embodiments of the present invention and formation methods of the structures are described. Note that the materials and the formation methods are not limited to the following description and materials and formation methods that have similar functions or effects can be used as appropriate.

[Substrate and Counter Substrate]

As the material of a substrate through which light is emitted, a material having a light-transmitting property, such as glass, quartz, or an organic resin can be used. A substrate provided to face the substrate through which light is emitted does not necessarily have a light-transmitting property, for which, other than the above materials, a material such as a metal, a semiconductor, ceramics, and a colored organic resin can be used. In the case where an electrically conductive substrate is used, the substrate preferably has an insulating property by oxidation of a surface or formation of an insulating film over a surface.

Examples of a method by which a surface of an electrically conductive substrate such as a metal substrate or an alloy substrate is insulated are an anodic oxidation method, an electrodeposition method, and the like. For example, in the case where an aluminum substrate is used as the substrate, owing to the high insulating property of aluminum oxide formed over a surface by an anodic oxidation method, a layer of the aluminum oxide can be formed thin, which is preferable. By an electrodeposition method, an organic resin such as a polyamide-imide resin or an epoxy resin can be formed over a substrate surface. Such an organic resin is preferred because, owing to its high insulating property and flexibility, a crack hardly occurs in the surface even when the substrate is bent in use. In addition, use of a material with high heat resistance can suppress change in the form of the substrate surface due to heat generated when the light-emitting device is driven.

In the case where an organic resin is used for the substrates, for example, any of the following can be used as the organic resin: polyester resins such as polyethylene terephthalate (PET) and polyethylene naphthalate (PEN); a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinylchloride resin, and the like. Further, a substrate in which a glass fiber is impregnated with an organic resin or a substrate in which an inorganic filler is mixed with an organic resin can also be used.

Especially in the case of the top-emission light-emitting device, a substrate having high thermal conductivity, such as a metal substrate, is preferably used as the substrate that is provided with a light-emitting element and faces the substrate through which light is emitted. A large lighting device including the light-emitting element might have a problem of heat generation from the light-emitting element, and the use of such a substrate having high thermal conductivity can enhance dissipation of the heat. For example, when a substrate of aluminum oxide, duralumin, or the like is used other than a stainless steel substrate, light weight and high heat dissipation can be achieved. Preferably, a stack of aluminum and aluminum oxide, a stack of duralumin and aluminum oxide, a stack of duralumin and magnesium oxide, or the like is used, in which case a substrate surface can have an insulating property.

When directly processed to form the structural body at least the end of which has an acute-angled shape, the counter substrate is formed using a material which has an insulating property and rigidity to the extent that the insulating layer over the substrate provided with a light-emitting element can be changed in form by the pressure at the bonding. For example, a material such as glass, quartz, or an organic resin can be used.

In the case where an insulating film is formed over the counter substrate and the insulating film is processed to form the structural body at least the end of which has an acute-angled shape, the counter substrate is formed using a substrate which has rigidity to the extent that the counter substrate is not changed in form by the bonding performed so that the structural body at least the end of which has an acute-angled shape can be buried in the insulating layer over the substrate provided with a light-emitting element.

[Light-Emitting Element]

As a material having a light-transmitting property which can be used for an electrode layer through which light is emitted, indium oxide, indium tin oxide (indium oxide-tin oxide), indium zinc oxide (indium oxide-zinc oxide), zinc oxide, zinc oxide to which gallium is added, graphene, or the like can be used.

For the electrode layer, a metal material such as gold, silver, platinum, magnesium, nickel, tungsten, chromium, molybdenum, iron, cobalt, copper, palladium, or titanium, or an alloy of any of these metal materials can be used. Alternatively, a nitride of the metal material (such as titanium nitride) or the like may be used. In the case where the metal material (or the nitride thereof) is used, the electrode layer is thinned so as to have a light-transmitting property.

For the electrode layer, a stacked film of any of the above materials can be used. For example, a stacked film of an alloy of silver and magnesium and indium oxide-tin oxide is preferably used, in which case electrical conductivity can be increased.

The thickness of the electrode layer through which light is emitted is, for example, greater than or equal to 50 nm and less than or equal to 300 nm, preferably greater than or equal to 80 nm and less than or equal to 130 nm, more preferably greater than or equal to 100 nm and less than or equal to 110 nm.

The EL layer at least includes a layer including a light-emitting organic compound. The EL layer can have a stacked-layer structure in which a layer including a substance having a high electron-transport property, a layer including a substance having a high hole-transport property, a layer including a substance having a high electron-injection property, a layer including a substance having a high hole-injection property, a layer including a bipolar substance (a substance having a high electron-transport property and a high hole-transport property), and the like are combined as appropriate.

In one embodiment of the present invention, a light-emitting element in which a plurality of EL layers is provided between an upper electrode layer and a lower electrode layer (a tandem light-emitting element) can be used. The number of the EL layers is preferably two to four (especially preferably three). An intermediate layer including a material having a high electron-transport property, a material having a hole-transport property, or the like may be included between these EL layers. Structure examples of the EL layers are detailed in Embodiment 3.

The electrode layer provided on the side facing the side toward which light is emitted is formed using a material having reflectivity. As the material having reflectivity, a metal such as aluminum, gold, platinum, silver, nickel, tungsten, chromium, molybdenum, iron, cobalt, copper, lanthanum, or palladium or an alloy containing any of these metals can be used. Any of the following can also be used: alloys containing aluminum (aluminum alloys) such as an alloy of aluminum and titanium, an alloy of aluminum and nickel, and an alloy of aluminum and neodymium; and alloys containing silver such as an alloy of silver and copper and an alloy of silver and magnesium. An alloy of silver and copper is preferable because of its high heat resistance. A metal film or a metal oxide film is stacked to be in contact with an aluminum alloy film, so that oxidation of the aluminum alloy film can be prevented. Examples of a material for the metal film or the metal oxide film are titanium, titanium oxide, and the like. Aluminum can also be used as a material of the electrode layer. However, in that case, since direct contact with indium oxide-tin oxide or the like might cause corrosion, the electrode layer is formed to have a stacked-layer structure in which aluminum is used for a layer that is not in contact with indium oxide-tin oxide or the like.

Note that an electrically conductive film used for the light-emitting element can be formed by a film formation method such as an evaporation method, a sputtering method, a CVD method, or the like. In addition, the EL layer can be formed by a film formation method such as an evaporation method or a coating method such as an inkjet method.

[Partition Wall]

As a material forming the partition wall, for example, an organic resin such as polyimide, acrylic, polyamide or epoxy, or an inorganic insulating material can be used. It is particularly preferable that the partition wall be formed using a photosensitive resin material to have an opening portion so that a sidewall of the opening portion can have a slope with a continuous curvature. Specifically, the curvature radius of a curve drawn by a cross-section of the partition wall is desirably approximately 0.2 μm to 2 μm. Although there is no particular limitation on a method of forming the partition wall, a sputtering method, an evaporation method, a printing method such as a screen printing method or an offset printing method, a droplet discharge method such as an inkjet method or a dispensing method, a coating method such as a slit coating method or a spin coating method, or the like can be used.

[Insulating Layer]

The insulating layer provided over the substrate provided with a light-emitting element can be formed using a material which has elasticity to the extent that the insulating layer can be changed in form when the structural body at least the end of which has an acute-angled shape is pressed against the insulating layer by the pressure at the bonding. For example, in the case where an organic resin is used, the elasticity can be obtained by the optimization of conditions for heat treatment or light irradiation for curing the organic resin. As the organic resin, for example, polyimide, acrylic, polyamide, epoxy, or the like can be used. As a method of forming the insulating layer, a printing method such as a screen printing method or an offset printing method, a droplet discharge method such as an inkjet method or a dispensing method, a coating method such as a slit coating method or a spin coating method, or the like can be used. In particular, use of a photosensitive organic resin is preferred. The insulating layer may be formed with the same material in the same step as the partition.

[Sealant]

A known material can be used for the sealant; for example, a thermosetting material or a UV curable material may be used. A two-component type epoxy adhesive or the like can also be used. For the sealant, a material capable of adhering inorganic materials, organic materials, or an inorganic material and an organic material, which depends on adhered portions, is used. Further, it is desirable that a material for the sealant allow as little moisture and oxygen as possible to penetrate through. A drying agent may be contained in the sealant. For example, a substance which absorbs moisture by chemical adsorption, such as an oxide of an alkaline-earth metal (e.g., calcium oxide or barium oxide), can be used. Alternatively, a substance which adsorbs moisture by physical adsorption, such as zeolite or silica gel, may be used as the drying agent.

This embodiment can be combined with any of the other embodiments described in this specification as appropriate.

Embodiment 2

In this embodiment, a structure example of a light-emitting device having a plurality of light-emitting elements, which is different from the above structure example, is described with reference to FIG. 5, FIG. 6 and FIG. 7.

⟨Structure Example⟩

Figure 5:
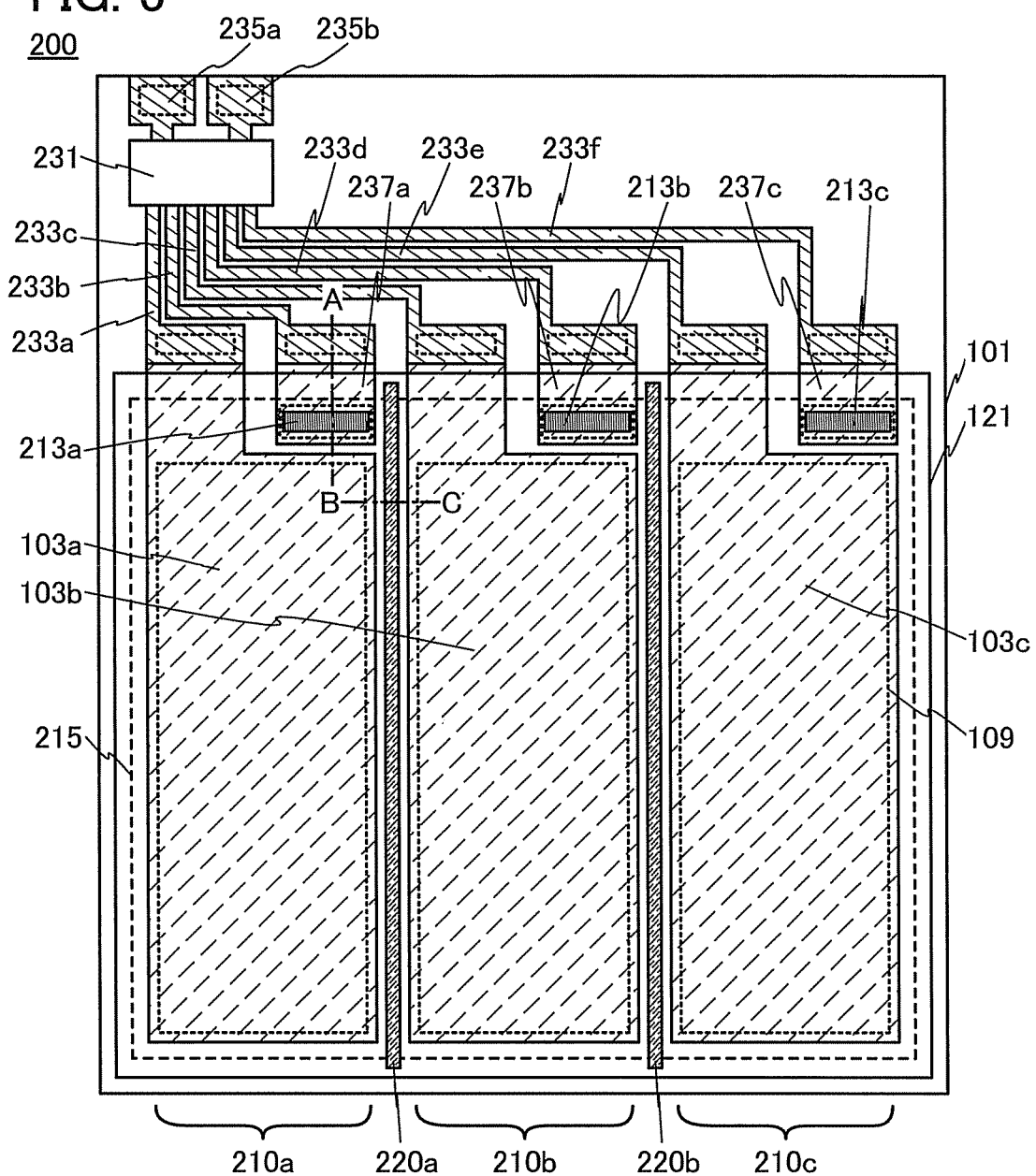
FIG. 5 illustrates a light-emitting device in accordance with one embodiment of the present invention.

A schematic top view of a light-emitting device 200 exemplified in this embodiment is illustrated in FIG. 5. The light-emitting device 200 includes three light-emitting elements (light-emitting elements 210a, 210b, and 210c), which are provided between the substrate 101 and the counter substrate 121, and a control portion 231 which controls operation of these elements. Note that in FIG. 5, some components (e.g., an EL layer or an upper electrode layer) are omitted for the sake of clarity.

Separating portions 220a and 220b for electrical insulation between upper electrode layers are each provided between the light-emitting elements. The separating portions 220a and 220b are provided to extend outside a region 215 for film formation, where EL layers and the upper electrode layers represented by broken lines in the drawing are formed. Further, the separating portion exemplified in Embodiment 1 can be applied to each of the separating portions 220a and 220b. Thus, the upper electrode layers of the light-emitting elements 210a, 210b, and 210c, into which the physical separation is made, are electrically insulated from each other.

The light-emitting elements each include a connection electrode layer (connection electrode layers 213a, 213b, and 213c) electrically connected to the respective upper electrode layers. A structure of the connection electrode layer is detailed later.

The lower electrode layer 103a of the light-emitting element 210a partly extends to the outside of the counter substrate 121 and is electrically connected to the control portion 231 through a wiring 233a. Further, the upper electrode layer 107a (not illustrated in the drawing) of the light-emitting element 210a is electrically connected to the control portion 231 through the connection electrode layer 213a, a connection wiring 237a provided therebelow, and a wiring 233b. The light-emitting elements 210b and 210c are also electrically connected to the control portion 231 through wirings 233c, 233d, 233e, and 233f and connection wirings 237b and 237c.

The control portion 231 is electrically connected to electrodes 235a and 235b electrically connected to an external power source such as a household power source, and electric power from the external power source is input to the control portion 231. In the control portion 231, a DC voltage suitable for operation of each of the light-emitting elements is generated based on the input electric power, and then applied to each element, thereby causing the elements to emit light. The control portion 231 includes a converter circuit such as an AC-DC converter, for example, when a household AC power source is employed as the external power source.

Further, the control portion 231 controls a voltage applied to each light-emitting element or a current flowing therethrough, and may have a function of on-off control for light emission, adjustment of luminance of light emission, or the like. To perform such a function, the control portion 231 may include a receiving portion for receiving a signal input from a remote controller or an operation portion such as a switch. Furthermore, the control portion 231 may include any of a variety of sensors (for heat, sounds, electromagnetic waves, or the like).

Figure 6:
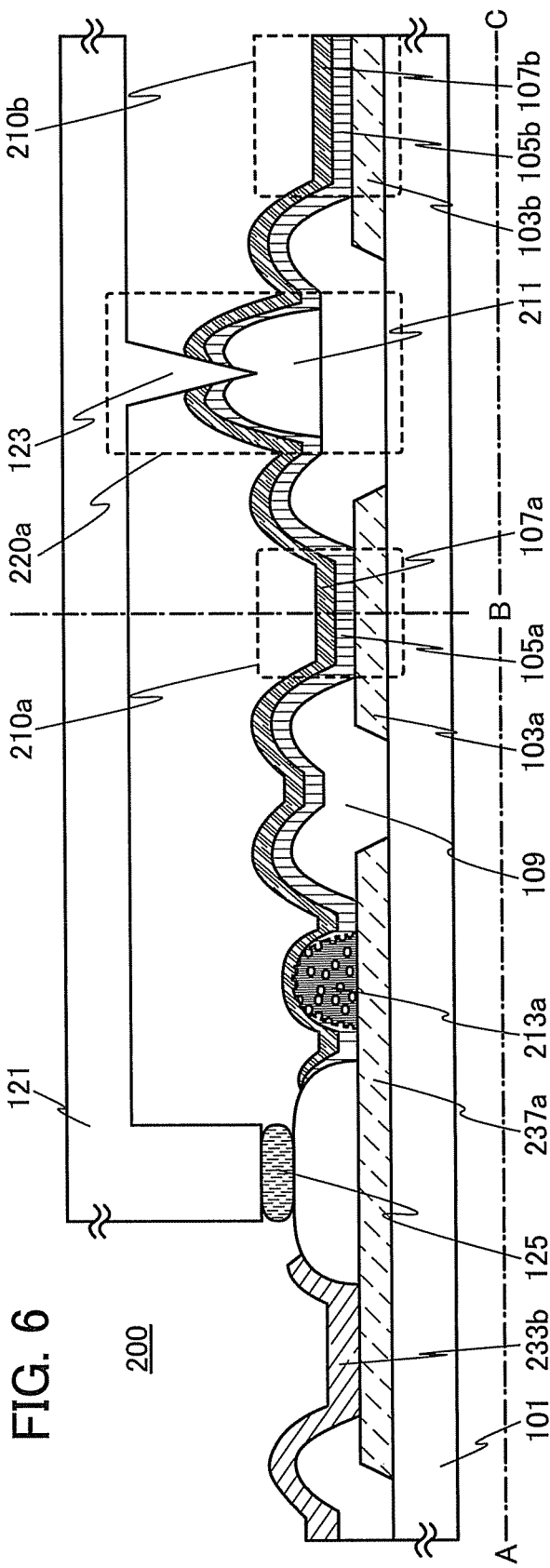
FIG. 6 illustrates a light-emitting device in accordance with one embodiment of the present invention.

Schematic cross-section along the cutting plane line A-B-C in FIG. 5 is illustrated in FIG. 6. The cutting plane line A-B intersects the connection electrode layer 213a and the cutting plane line B-C intersects a region including the separating, portion 220a.

With the sealant 125, the surface of the convex portion at the outer periphery of the counter substrate 121 is adhered to the partition wall 109 provided over the connection wiring 237a; thus, the counter substrate 121 and the substrate 101 are adhered to each other.

The connection wiring 237a is electrically connected to the wiring 233b electrically connected to the control portion 231 outside a region where the connection wiring 237a overlaps with the counter substrate 121. In the region where the connection wiring 237a overlaps with the counter substrate 121, the connection wiring 237a is electrically connected to the connection electrode layer 213a formed over the connection wiring 237a.

The connection electrode layer 213a is formed with an electrically conductive material and has a very rough, uneven surface. Here, part of the EL layer formed over the connection electrode layer 213a fails to cover the roughness of the surface and consequently is split, so that part of a surface of the connection electrode layer 213a is exposed. Furthermore, part of the upper electrode layer formed over the EL layer is electrically connected to the exposed connection electrode layer 213a. In this way, electrical connection of the connection electrode layer 213a to the upper electrode layer can be ensured even if a stack of the EL layer and the upper electrode layer are formed over the connection electrode layer 213a.

For example, the connection electrode layer 213a can be formed by a printing method such as a screen printing method. An electrically conductive paste used in a printing method contains electrically conductive particles, an organic resin, and an organic solvent, and an electrically conductive structure can be formed as follows: the organic solvent is vaporized while part of the organic resin is decomposed, and the electrically conductive particles are welded to each other, by heat treatment such as baking. The formed structure may be porous and have an uneven surface depending on a material of the organic resin or a particle diameter of the electrically conductive particle. The connection electrode layer 213a can also be formed in the following way. An electrically conductive film is formed by a film formation method such as a sputtering method or an evaporation method and then an unnecessary portion of the film is etched to form a pattern of the connection electrode layer 213a.

After that, a resist is formed in a slit pattern, a lattice pattern, or a dot pattern over a surface of the connection electrode layer 213a and the electrically conductive film is subjected to half etching such that the electrically conductive film does not disappear; thus, an uneven shape can be formed. Alternatively, plasma treatment or reverse sputtering treatment may be performed on the surface to form an uneven shape.

In the separating portion 220a, an insulating layer 211 is formed over the partition wall 109 covering the edge portions of the lower electrode layer 103a and the lower electrode layer 103b. The insulating layer 211 is similar to the insulating layer 111 exemplified in Embodiment 1. Further, the surface of the counter substrate 121, which faces the substrate 101, is provided with the structural body 123 having an acute-angled shape, which is provided so as pass through the EL layer and the upper electrode layer formed over the insulating layer 211 and to be buried in the insulating layer 211.

Thus, the upper electrode layer 107a and the upper electrode layer 107b, into which the upper electrode layer is physically separated in such a way that the separating portion 220a is the boundary therebetween, are electrically insulated from each other.

Owing to the separating portion 220a provided between the light-emitting elements 210a and 210b as described above, the light-emitting elements 210a and 210b can be electrically insulated from each other. The light-emitting element 210c is also electrically insulated from either of the light-emitting elements 210a and 210b.

Since electrical insulation is ensured by a separating portion provided between a plurality of light-emitting elements even with the EL layer and the upper electrode layer formed without use of a metal mask, the light-emitting device 200 as described above can be a highly reliable light-emitting device for which the trouble due to a metal mask is prevented.

The above is the explanation of a structure of the light-emitting device 200. Next, a mode of a light-emitting device which is different from the above is exemplified.

⟨Modification Example⟩

In many cases, an AC-DC converter, which converts an alternating current voltage from a household AC voltage into a DC voltage for operation of a light-emitting device, tends to have lower conversion efficiency as a voltage value after conversion is smaller. In view of the above, a plurality of light-emitting elements is connected in series to increase the effective driving voltage of a device as a whole, so that the conversion efficiency of an AC-DC converter can be improved. A mode of a light-emitting device in which a plurality of light-emitting elements is connected in series is described below.

Figure 7:
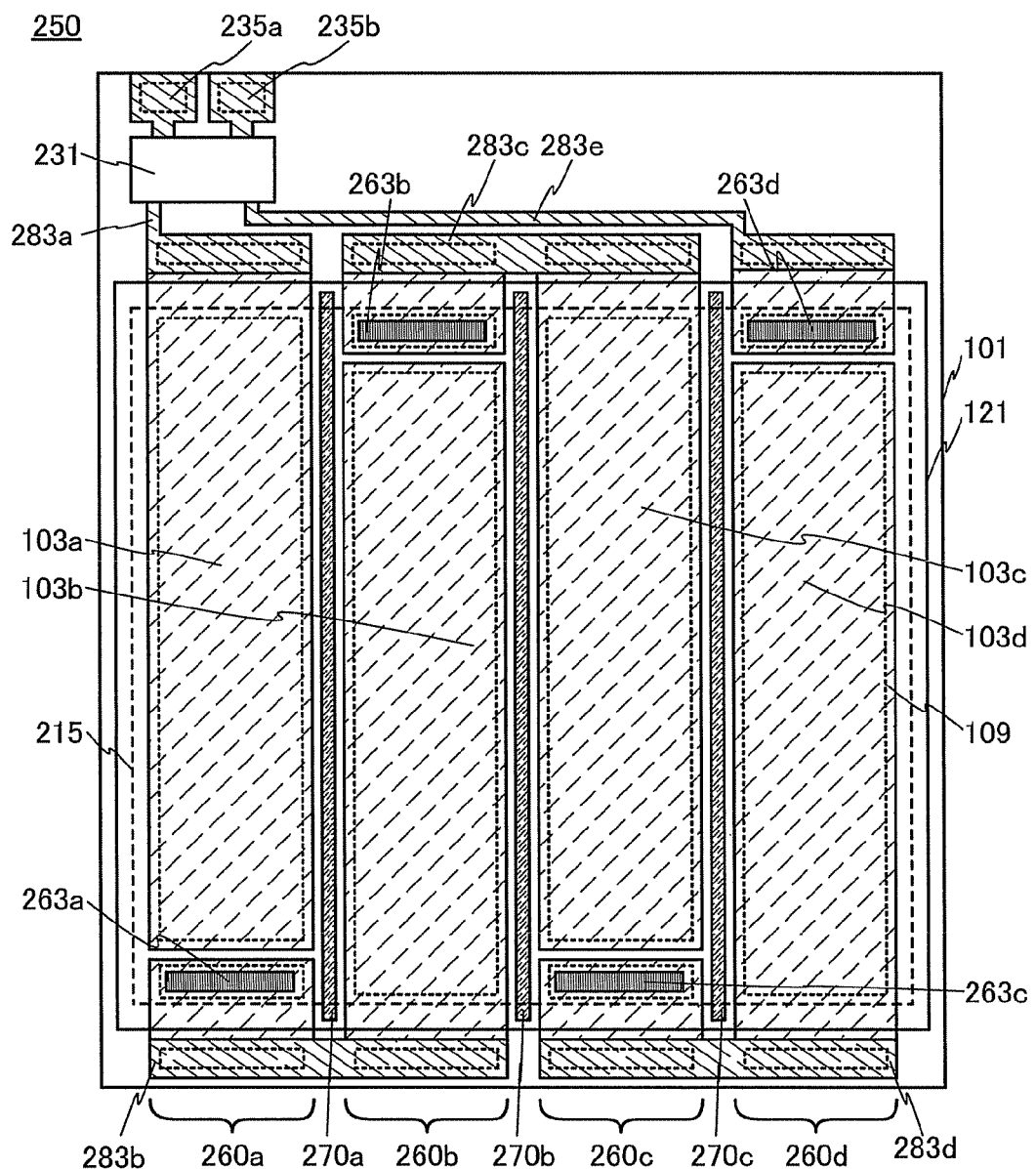
FIG. 7 illustrates a light-emitting device in accordance with one embodiment of the present invention.

The light-emitting device 250 illustrated in FIG. 7 is a light-emitting device in which four light-emitting elements (light-emitting elements 260a, 260b, 260c, and 260d) are connected in series. Note that in FIG. 7, some components (e.g., an EL layer or an upper electrode layer) are omitted for the sake of clarity.

A wiring 283a electrically connected to the control portion 231 is electrically connected to the lower electrode layer 103a at one end of the light-emitting element 260a. In addition, an upper electrode layer (not illustrated in the drawing) of the light-emitting element 260a is electrically connected to a wiring 283b through a connection electrode layer 263a provided at the other end of the light-emitting element 260a. The wiring 283b is further electrically connected to the lower electrode layer 103b of the light-emitting element 260b adjacent to the light-emitting element 260a. Thus, the light-emitting element 260a and the light-emitting element 260b are connected in series.

In the same way, the light-emitting elements 260b and 260c are connected in series through a connection electrode layer 263b and a wiring 283c, and the light-emitting elements 260c and 260d are connected in series through a connection electrode layer 263c and a wiring 283d. Further, an upper electrode layer (not illustrated in the drawing) of the light-emitting element 260d is electrically connected to the control portion 231 through a connection electrode layer 263d and a wiring 283e.

By such connections, the four light-emitting elements (light-emitting elements 260a, 260b, 260c, and 260d) are connected in series, and operation of the light-emitting elements is controlled by the control portion 231.

Further, separating portions 270a, 270b, and 270c are each provided between the adjacent light-emitting elements. The structure of the separating portion exemplified above can be applied to the structure of each of these separating portions. Consequently, electrical insulation between the adjacent light-emitting elements can be ensured.

Having such a structure, light-emitting elements connected in series can be manufactured without use of a metal mask. Thus, the effective driving voltage of the whole light-emitting device can be increased and the conversion efficiency of the AC-DC converter can be improved accordingly, so that the light-emitting device can have low power consumption.

Note that the number of the light-emitting elements connected in series is four in the above structure but is not limited thereto and may be two or more. Further, arrangement of the connection electrode layers and the wirings may be modified so that a plurality of light-emitting elements can be connected in parallel or serial connection and parallel connection can be combined.

This embodiment can be combined with any of the other embodiments described in this specification as appropriate.

Embodiment 3

In this embodiment, examples of EL layers that can be applied to one embodiment of the present invention is described with reference to FIGS. 8A to 8C.

Figure 8A:
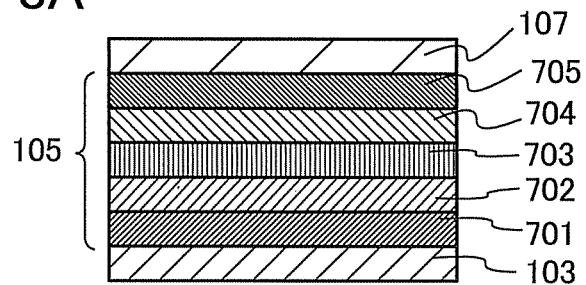
FIGS. 8A to 8C each illustrate an EL layer in accordance with one embodiment of the present invention.

The EL layer 105 illustrated in FIG. 8A is provided between a lower electrode layer 103 and the upper electrode layer 107. Structures of the lower electrode layer 103 and the upper electrode layer 107 can be similar to those of the lower electrode layer and the upper electrode layer which are exemplified in the above embodiments.

A light-emitting element including the EL layer 105, which is exemplified in this embodiment, can be applied to any of the light-emitting devices exemplified in the above embodiments.

The EL layer 105 includes at least a light-emitting layer including a light-emitting organic compound. In addition, the EL layer 105 can have a stacked-layer structure in which a layer including a substance having a high electron-transport property, a layer including a substance having a high hole-transport property, a layer including a substance having a high electron-injection property, a layer including a substance having a high hole-injection property, a layer including a bipolar substance (a substance having a high electron-transport property and a high hole-transport property), and the like are combined as appropriate. In this embodiment, in the EL layer 105, a hole-injection layer 701, a hole-transport layer 702, a layer 703 containing a light-emitting organic compound, an electron-transport layer 704, and an electron-injection layer 705 are stacked in this order from the lower electrode layer 103 side. Note that the stacking order may be inversed.

The way how the light-emitting element illustrated in FIG. 8A is fabricated is described.

The hole-injection layer 701 is a layer including a substance having a high hole-injection property. As the substance having a high hole-injection property, for example, a metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide can be used. A phthalocyanine-based compound such as phthalocyanine (abbreviation: H₂Pc), or copper(II) phthalocyanine (abbreviation: CuPc) can also be used.

An aromatic amine compound, which is a low molecular organic compound, or the like can also be used.

Any of high molecular compounds (e.g., oligomers, dendrimers, or polymers) can also be used. A high molecular compound to which acid is added can also be used.

In particular, for the hole-injection layer 701, a composite material in which an acceptor substance (an electron acceptor) is mixed with an organic compound having a high hole-transport property is preferably used. With the use of the composite material in which an acceptor substance is added to a substance having a high hole-transport property, excellent hole injection from the lower electrode layer 103 can be obtained, which results in a reduction in the driving voltage of the light-emitting element. Such a composite material can be funned by co-evaporation of a substance having a high hole-transport property and an acceptor substance. When the hole-injection layer 701 is formed using the composite material, hole injection from the lower electrode layer 103 into the EL layer 105 is facilitated.

As the organic compound used for the composite material, any of a variety of compounds such as aromatic amine compounds, carbazole derivatives, aromatic hydrocarbons, and high molecular compounds (e.g., oligomers, dendrimers, and polymers) can be used. The organic compound used for the composite material is preferably an organic compound having a high hole-transport property. Specifically, a substance having a hole mobility of $10^{-6}$ cm$^2$/Vs or higher is preferably used. Note that other than these substances, a substance that has a property of transporting more holes than electrons may be used.

As the organic compound which can be used for the composite material, an aromatic amine compound, a carbazole derivative, or an aromatic hydrocarbon compound having a high hole mobility can be used.

Examples of the acceptor substance include organic compounds and transition metal oxides. In addition, oxides of metals belonging to Groups 4 to 8 in the periodic table can be also given. Specifically, vanadium oxide, niobium oxide, tantalum oxide, chromium oxide, molybdenum oxide, tungsten oxide, manganese oxide, and rhenium oxide are preferable since their electron-accepting property is high. Among these, molybdenum oxide is especially preferred since it is stable in the air, has a low hygroscopic property, and is easily handled.

The composite material may be formed using the above-described electron acceptor and the above-described high molecular compound to be used for the hole-injection layer 701.

The hole-transport layer 702 is a layer including a substance having a high hole-injection property. Examples of the substance having a high hole-transport property include aromatic amine compounds. These substances are mainly ones that have a hole mobility of $10^{-6}$ cm$^2$/Vs or higher. Note that other than these substances, a substance that has a property of transporting more holes than electrons may be used. Note that the layer including a substance having a high hole-transport property is not limited to a single layer and may be a stack of two or more layers including any of the above substances.

For the hole-transport layer 702, any of carbazole derivatives, anthracene derivatives, or other high molecular compounds having a high hole-transport property may be used.

For the layer 703 containing a light-emitting organic compound, a fluorescent compound which exhibits fluorescence or a phosphorescent compound which exhibits phosphorescence can be used.

Note that the layer 703 including a light-emitting organic compound may have a structure in which the above light-emitting organic compound (a guest material) is dispersed in another substance (a host material). As a host material, a variety of kinds of materials can be used, and it is preferable to use a substance which has a higher lowest unoccupied molecular orbital level (LUMO level) than the light-emitting material and has a lower highest occupied molecular orbital level (HOMO level) than the light-emitting material.

Plural kinds of materials can be used as the host material. For example, in order to suppress crystallization, a substance which suppresses crystallization may be further added. In addition, another substance may be added in order to efficiently transfer energy to the guest material.

When a structure in which a guest material is dispersed in a host material is employed, crystallization of the layer 703 containing a light-emitting organic compound can be suppressed. Further, concentration quenching due to high concentration of the guest material can be suppressed.

For the layer 703 including a light-emitting organic compound, a high molecular compound can be used.

Further, when a plurality of layers each including a light-emitting organic compound is provided and the emission colors of the layers are made different, light emission of a desired color can be obtained from the light-emitting element as a whole. For example, in a light-emitting element including two layers each including a light-emitting organic compound, the emission color of a first layer including a light-emitting organic compound and the emission color of a second layer including a light-emitting organic compound are made complementary, so that the light-emitting element as a whole can emit white light. Note that "complementary colors" refer to colors that can produce an achromatic color when mixed. In other words, by mixing light obtained from substances which emit light of complementary colors, white light emission can be obtained. This can be applied to a light-emitting element including three or more layers each including a light-emitting organic compound.

The electron-transport layer 704 is a layer including a substance having a high electron-transport property. Examples of the substance having a high electron-transport property are mainly ones that have an electron mobility of $10^{-6}$ cm$^2$/Vs or higher. Furthermore, the electron-transport layer is not limited to a single layer and may be a stack of two or more layers including any of the above substances.

The electron-injection layer 705 is a layer including a substance having a high electron-injection property. For the electron-injection layer 705, an alkali metal, an alkaline-earth metal, or a compound thereof, such as lithium, cesium, calcium, lithium fluoride, cesium fluoride, calcium fluoride, or lithium oxide, can be used. A rare-earth metal compound such as erbium fluoride can also be used. Any of the above substances for foaming the electron-transport layer 704 can also be used.

Note that the hole-injection layer 701, the hole-transport layer 702, the layer 703 containing a light-emitting organic compound, the electron-transport layer 704, and the electron-injection layer 705 which are described above can each be formed by a method such as an evaporation method (e.g., a vacuum evaporation method), an inkjet method, or a coating method.

Figure 8B:
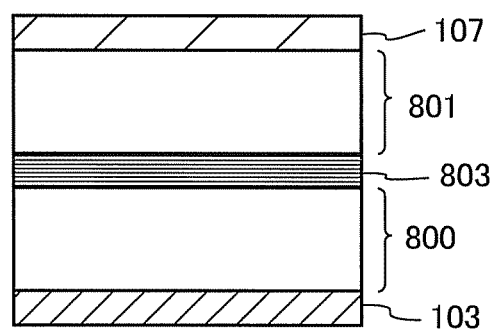

As illustrated in FIG. 8B, a plurality of EL layers may be stacked between the lower electrode layer 103 and the upper electrode layer 107. In that case, a charge generation layer 803 is preferably provided between a first EL layer 800 and a second EL layer 801 which are stacked. The charge generation layer 803 can be formed using the above-described composite material. Further, the charge generation layer 803 may have a stacked-layer structure including a layer including the composite material and a layer including another material. In that case, as the layer including another material, a layer including a substance having an electron-donating property (a donor substance) and a substance having a high electron-transport property, a layer formed of a transparent conductive film, or the like can be used. A light-emitting element having such a structure is unlikely to suffer the problem of energy transfer, quenching, or the like and gives wider choice of materials, thereby easily having both high light emission efficiency and a long lifetime. In addition, a light-emitting element having such a structure can easily provide phosphorescence from one EL layer and fluorescence from another EL layer. This structure can be combined with any of the above-mentioned EL layer structures.

Furthermore, different emission colors of the EL layers enable light emission of a desired color to be obtained from the light-emitting element as a whole. For example, the emission colors of first and second EL layers are complementary in a light-emitting element having the two EL layers, so that the light-emitting element can be made to emit white light as a whole. Note that "complementary colors" refer to colors that can produce an achromatic color when mixed. In other words, when light emissions obtained from substances which emit light of complementary colors are mixed, white light emission can be obtained. This can be applied to a light-emitting element having three or more EL layers.

Figure 8C:
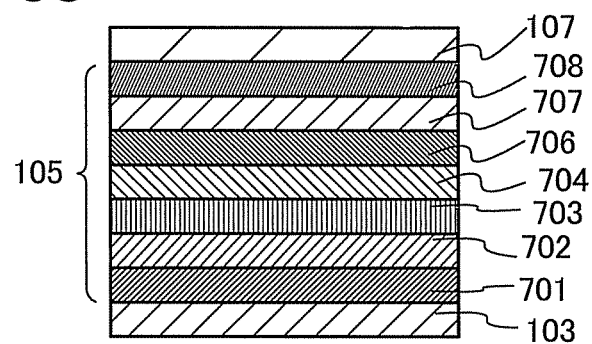

As illustrated in FIG. 8C, the EL layer 105 may include, between the lower electrode layer 103 and the upper electrode layer 107, the hole-injection layer 701, the hole-transport layer 702, the layer 703 containing a light-emitting organic compound, the electron-transport layer 704, an electron-injection buffer layer 706, an electron-relay layer 707, and a composite material layer 708 which is in contact with the upper electrode layer 107.

The composite material layer 708 is preferably provided in contact with the upper electrode layer 107, in which case damage caused to the EL layer 105 particularly when the upper electrode layer 107 is formed using a sputtering method can be reduced. The composite material layer 708 can be formed using the above-described composite material in which an acceptor substance is mixed with an organic compound having a high hole-transport property.

With the electron-injection buffer layer 706, an injection barrier between the composite material layer 708 and the electron-transport layer 704 can be reduced, and accordingly electrons generated in the composite material layer 708 can be easily injected into the electron-transport layer 704.

For the electron-injection buffer layer 706, any of the following substances having a high electron-injection property is used: alkali metals, alkaline-earth metals, rare-earth metals, compounds thereof (including alkali metal compounds (including oxides such as lithium oxide, halides, and carbonates such as lithium carbonate or cesium carbonate), alkaline-earth metal compounds (including oxides, halides, and carbonates), and rare-earth metal compounds (including oxides, halides, and carbonates)).

In addition, in the case where the electron-injection buffer layer 706 contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can also be used other than any of alkali metals, alkaline-earth metals, rare-earth metals, compounds thereof (including alkali metal compounds (including oxides such as lithium oxide, halides, and carbonates such as lithium carbonate or cesium carbonate), alkaline-earth metal compounds (including oxides, halides, and carbonates), and rare-earth metal compounds (including oxides, halides, and carbonates)). Note that as the substance having a high electron-injection property, a material similar to the material for the electron transport layer 704 described above can be used.

The electron-relay layer 707 is preferably formed between the electron-injection buffer layer 706 and the composite material layer 708. The electron-relay layer 707 is not necessarily provided; however, with the electron-relay layer 707 having a high electron-transport property, electrons can be rapidly transported to the electron-injection buffer layer 706.

The structure in which the electron-relay layer 707 is provided between the composite material layer 708 and the electron-injection buffer layer 706 is a structure in which the acceptor substance included in the composite material layer 708 and the donor substance included in the electron-injection buffer layer 706 are less likely to interact with each other, and thus their functions hardly interfere with each other. Accordingly, an increase in the driving voltage can be prevented.

The electron-relay layer 707 contains a substance having a high electron-transport property and is formed so that the LUMO level of the substance having a high electron-transport property is located between the LUMO level of the acceptor substance included in the composite material layer 708 and the LUMO level of the substance having a high electron-transport property which is included in the electron-transport layer 704. In the case where the electron-relay layer 707 contains a donor substance, the donor level of the donor substance is controlled so as to be located between the LUMO level of the acceptor substance in the composite material layer 708 and the LUMO level of the substance having a high electron-transport property which is included in the electron-transport layer 704. As a specific value of the energy level, the LUMO level of the substance having a high electron-transport property which is included in the electron-relay layer 707 is preferably greater than or equal to $-5.0$ eV, more preferably greater than or equal to $-5.0$ eV and less than or equal to $-3.0$ eV.

As the substance having a high electron-transport property which is included in the electron-relay layer 707, a phthalocyanine-based material or a metal complex having a metal-oxygen bond and an aromatic ligand is preferably used.

As the metal complex having a metal-oxygen bond and an aromatic ligand, which is included in the electron-relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex which has a metal-oxygen double bond is considered stable. Thus, the use of the metal complex having the metal-oxygen double bond makes it possible to drive a light-emitting element at low voltage more stably.

As a metal complex having a metal-oxygen bond and an aromatic ligand, a phthalocyanine-based material is preferred. In particular, a material in which a metal-oxygen double bond is more likely to act on another molecular in terms of a molecular structure and having a high acceptor property is preferably used.

Note that as the phthalocyanine-based materials described above, a phthalocyanine-based material having a phenoxy group is preferred. Specifically, a phthalocyanine derivative having a phenoxy group, such as PhO-VOPc, is preferred. A phthalocyanine derivative having a phenoxy group is soluble in a solvent. For that reason, such a phthalocyanine derivative has an advantage of being easily handled during formation of a light-emitting element. Further, owing to the solubility in a solvent, such a phthalocyanine derivative also has an advantage of facilitating maintenance of an apparatus used for forming a film.

The electron-relay layer 707 may further contain a donor substance. As the donor substance, an organic compound such as tetrathianaphthacene (abbreviation: TTN), nickelocene, or decamethylnickelocene can be used other than any of alkali metals, alkaline-earth metals, rare-earth metals, compounds thereof (including alkali metal compounds (including oxides such as lithium oxide, halides, and carbonates such as lithium carbonate or cesium carbonate), alkaline-earth metal compounds (including oxides, halides, and carbonates), and rare-earth metal compounds (including oxides, halides, and carbonates)). When such a donor substance is included in the electron-relay layer 707, electrons can be transferred easily and the light-emitting element can be, driven at lower voltage.

In the case where a donor substance is included in the electron-relay layer 707, in addition to the materials described above as the substance having a high electron-transport property, a substance having a LUMO level greater than the acceptor level of the acceptor substance included in the composite material layer 708 can be used. Specifically, it is preferable to use a substance having a LUMO level higher than or equal to −5.0 eV, preferably higher than or equal to −5.0 eV and lower than or equal to −3.0 eV. As examples of such a substance, a perylene derivative, a nitrogen-containing condensed aromatic compound, and the like are given. Note that a nitrogen-containing condensed aromatic compound is preferably used for the electron-relay layer 707 because of its stability.

Note that in the case where a donor substance is included in the electron-relay layer 707, the electron-relay layer 707 may be formed by a method such as co-evaporation of the substance having a high electron-transport property and the donor substance.

The hole-injection layer 701, the hole-transport layer 702, the layer 703 containing a light-emitting organic compound, and the electron-transport layer 704 may be formed using the above-described materials.

In the above manner, the EL layer 105 of this embodiment can be manufactured.

This embodiment can be combined with any of the other embodiments described in this specification as appropriate.

Embodiment 4

In this embodiment, examples of the light-emitting device of one embodiment of the present invention are described with reference to FIGS. 9A and 9B.

In this embodiment, a lighting device whose light-emitting portion has a curved surface can be provided.

The light-emitting device of one embodiment of the present invention can be used for lighting in an automobile; for example, lighting can be provided for a dashboard, a ceiling, and the like.

Figure 9A:
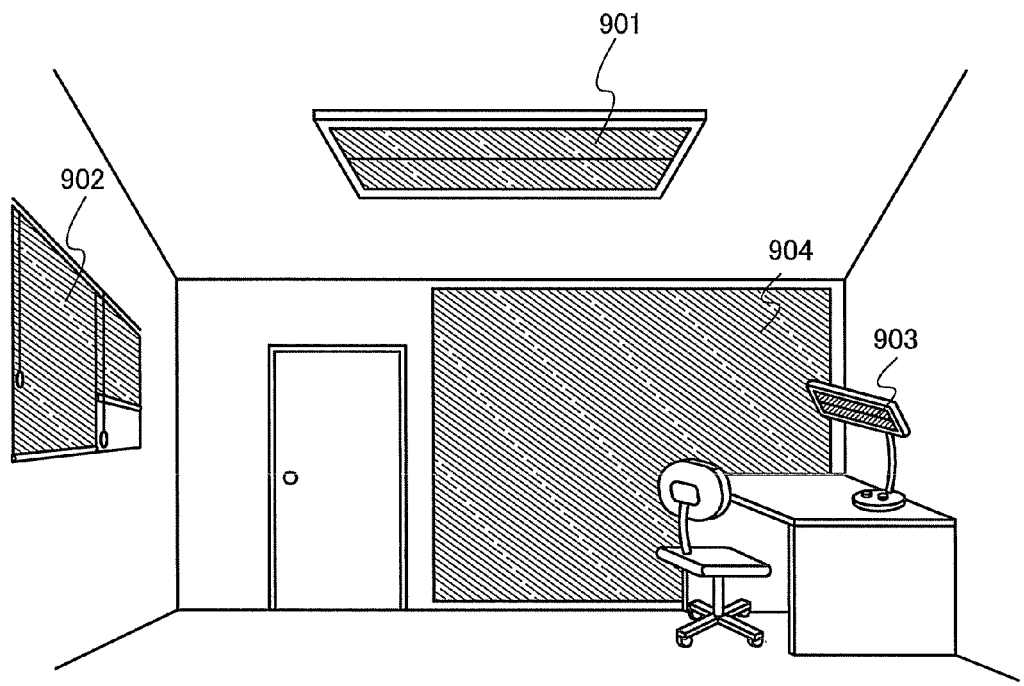
FIGS. 9A and 9B illustrate lighting devices to each of which a light-emitting device in accordance with one embodiment of the present invention is applied.

FIG. 9A illustrates an interior lighting device 901, a desk lamp 903, and a planar lighting device 904, to each of which the light-emitting device of one embodiment of the present invention, is applied. Since the light-emitting device can have a larger area, it can be used as a lighting device having a large area. Further, since the light-emitting device is thin, it can be mounted on a wall. Furthermore, the light-emitting device can also be used as a roll-type lighting device 902.

Figure 9B:
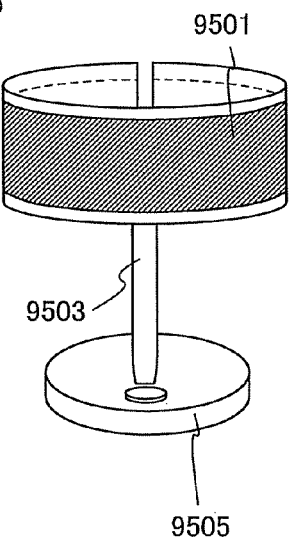

Another example of the lighting device is illustrated in FIG. 9B. A desk lamp illustrated in FIG. 9B includes a lighting portion 9501, a support 9503, a support base 9505, and the like. The lighting portion 9501 includes the light-emitting device of one embodiment of the present invention. As described above, in one embodiment of the present invention, a lighting device having a curved surface or a lighting device having a flexible lighting portion can be provided. The use of a flexible light-emitting device for a lighting device as described above not only improves the degree of freedom in design of the lighting device but also enables the lighting device to be mounted on a portion having a curved surface, such as the ceiling or dashboard of an automobile.

This embodiment can be combined with any of the other embodiments described in this specification as appropriate.

This application is based on Japanese Patent Application Serial No. 2011-085581 filed with the Japan Patent Office on Apr. 7, 2011, the entire contents of which are hereby incorporated by reference.

What is claimed is:

1. A light-emitting device comprising:
a first light-emitting element including a first lower electrode layer, a first upper electrode layer over the first lower electrode layer, and a first layer including a light-emitting organic compound interposed between the first lower electrode layer and the first upper electrode layer;
a second light-emitting element being adjacent to the first light-emitting element and including a second lower electrode layer, a second upper electrode layer over the second lower electrode layer, and a second layer including a light-emitting organic compound interposed between the second lower electrode layer and the second upper electrode layer;
an insulating layer including a depression, the depression being between the first light-emitting element and the second light-emitting element; and
a structural body,
wherein the insulating layer covers at least an edge portion of the first lower electrode layer and an edge portion of the second lower electrode layer,
wherein an end of the structural body is stuck in the insulating layer, and
wherein the first upper electrode layer is formed in a same layer as the second upper electrode layer and is separated over the depression of the insulating layer from the second upper electrode layer.

2. The light-emitting device according to claim 1, wherein the first light-emitting element, the second light-emitting element, and the insulating layer are provided over a first substrate,
wherein the first light-emitting element, the second light-emitting element, and the insulating layer face a second substrate, and
wherein a sealing material is provided between the second substrate and the first light-emitting element and between the second substrate and the second light-emitting element.

3. The light-emitting device according to claim 1, wherein the first light-emitting element, the second light-emitting element, and the insulating layer are provided over a first substrate,
wherein the first light-emitting element, the second light-emitting element, and the insulating layer face a second substrate, and
wherein a space is formed between the second substrate and the first light-emitting element and between the second substrate and the second light-emitting element.

4. The light-emitting device according to claim 1, wherein a side surface of the first upper electrode layer is aligned with a side surface of the first layer.

5. The light-emitting device according to claim 4, wherein the side surface of the first upper electrode layer and the side surface of the first layer are aligned with part of an exposed surface of the depression.

6. The light-emitting device according to claim 1, wherein the insulating layer comprises a material selected from the group consisting of polyimide, acrylic, polyamide, and epoxy.

7. The light-emitting device according to claim 1, wherein the first lower electrode layer is configured to transmit light from the first layer.

8. The light-emitting device according to claim 1, wherein the first upper electrode layer is configured to transmit light from the first layer.

9. A light-emitting device comprising:
a first light-emitting element including a first lower electrode layer, a first upper electrode layer over the first lower electrode layer, and a first layer including a light-emitting organic compound interposed between the first lower electrode layer and the first upper electrode layer;
a second light-emitting element being adjacent to the first light-emitting element and including a second lower electrode layer, a second upper electrode layer over the second lower electrode layer, and a second layer including a light-emitting organic compound interposed between the second lower electrode layer and the second upper electrode layer;
an insulating layer including a depression, the depression being between the first light-emitting element and the second light-emitting element; and
a structural body,
wherein at least an end of the structural body has an acute-angled shape,
wherein the insulating layer covers at least an edge portion of the first lower electrode layer and an edge portion of the second lower electrode layer,
wherein the end of the structural body is stuck in the insulating layer, and
wherein the first upper electrode layer is formed in a same layer as the second upper electrode layer and is separated over the depression of the insulating layer from the second upper electrode layer by the structural body.

10. The light-emitting device according to claim 9, wherein the first light-emitting element, the second light-emitting element, and the insulating layer are provided over a first substrate,
wherein the first light-emitting element, the second light-emitting element, and the insulating layer face a second substrate, and
wherein a space is formed between the second substrate and the first light-emitting element and between the second substrate and the second light-emitting element.

11. The light-emitting device according to claim 10, wherein the structural body is provided over the second substrate.

12. The light-emitting device according to claim 9, wherein a side surface of the first upper electrode layer is aligned with a side surface of the first layer.

13. The light-emitting device according to claim 12, wherein the side surface of the first upper electrode layer and the side surface of the first layer are aligned with part of an exposed surface of the depression.

14. The light-emitting device according to claim 9, wherein the end of the structural body is in contact with the insulating layer at the depression.

15. The light-emitting device according to claim 9, wherein the insulating layer comprises a material selected from the group consisting of polyimide, acrylic, polyamide, and epoxy.

16. The light-emitting device according to claim 9, wherein the first lower electrode layer is configured to transmit light from the first layer.

17. The light-emitting device according to claim 9, wherein the first upper electrode layer is configured to transmit light from the first layer.

* * * * *